United States Patent
Yun et al.

(10) Patent No.: US 11,275,444 B2
(45) Date of Patent: Mar. 15, 2022

(54) SHAPE-VARIABLE ELECTRONIC DEVICE AND OPERATION METHOD OF THE SAME

(71) Applicant: Electronics and Telecommunications Research Institute, Daejeon (KR)

(72) Inventors: Sung Ryul Yun, Daejeon (KR); Suntak Park, Daejeon (KR); Seongcheol Mun, Sejong-si (KR); Bong Je Park, Daejeon (KR); Seung Koo Park, Sejong-si (KR); JaeWoong Yoon, Seoul (KR); Inwook Hwang, Sejong-si (KR); Jeong Muk Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/976,950

(22) PCT Filed: Jan. 21, 2020

(86) PCT No.: PCT/KR2020/000975
§ 371 (c)(1),
(2) Date: Aug. 31, 2020

(87) PCT Pub. No.: WO2020/153693
PCT Pub. Date: Jul. 30, 2020

(65) Prior Publication Data
US 2021/0365121 A1 Nov. 25, 2021

(30) Foreign Application Priority Data
Jan. 21, 2019 (KR) .......... 10-2019-0007798
Dec. 9, 2019 (KR) .......... 10-2019-0163042

(51) Int. Cl.
*G06F 3/01* (2006.01)
*G06F 3/041* (2006.01)
(Continued)

(52) U.S. Cl.
CPC .............. *G06F 3/016* (2013.01); *G06F 3/041* (2013.01); *G05D 25/02* (2013.01);
(Continued)

(58) Field of Classification Search
CPC .......... G06F 3/016; G06F 2203/04809; G06F 2203/014; G06F 3/041; G06F 2203/04102; G05D 25/02; G09B 21/004; H01L 27/323
(Continued)

(56) References Cited

U.S. PATENT DOCUMENTS 8,663,755 B2 3/2014 Maeda et al.
9,017,795 B2 4/2015 Keefe et al.
(Continued)

FOREIGN PATENT DOCUMENTS

KR 10-2012-0116467 10/2012
KR 10-2015-0065554 6/2015
(Continued)

OTHER PUBLICATIONS

International Search Report, with English translation, for International Application No. PCT/KR2020/000975, dated Apr. 28, 2020.
(Continued)

*Primary Examiner* — Koosha Sharifi-Tafreshi
(74) *Attorney, Agent, or Firm* — Kile Park Reed & Houtteman PLLC

(57) ABSTRACT

The present invention relates to a shape-variable electronic device and an operation method of the same and, more specifically, the shape-variable electronic device includes: a substrate having a cell region; a light source unit on the cell
(Continued)

region; and a flexible layer vertically spaced apart from the light source unit. The flexible layer includes an actuator part that changes a shape of the flexible layer, and the actuator part includes: a photo-thermal response part that receives light emitted from the light source unit and generates thermal energy; a deformation part which receives the thermal energy from the photo-thermal response part and of which mechanical stiffness is reduced; and a top electrode and a bottom electrode on both surfaces of the deformation part, respectively.

20 Claims, 22 Drawing Sheets

(51) Int. Cl.
G09B 21/00 (2006.01)
G05D 25/02 (2006.01)
H01L 27/32 (2006.01)

(52) U.S. Cl.
CPC .. *G06F 2203/04102* (2013.01); *G09B 21/004* (2013.01); *H01L 27/323* (2013.01)

(58) Field of Classification Search
USPC ........................................................ 715/702
See application file for complete search history.

(56) References Cited

U.S. PATENT DOCUMENTS

| 9,075,525 | B2 | 7/2015 | Ciesla et al. |
| 9,323,328 | B2 | 4/2016 | Kim et al. |
| 9,829,924 | B2 | 11/2017 | Shin et al. |
| 10,381,427 | B2 | 8/2019 | Lim et al. |
| 10,444,838 | B2 | 10/2019 | Khoshkava et al. |
| 2006/0274047 | A1 | 12/2006 | Spath et al. |
| 2010/0162109 | A1* | 6/2010 | Chatterjee ............... G06F 3/016 715/702 |
| 2010/0177050 | A1* | 7/2010 | Heubel ................... G06F 3/016 345/173 |
| 2010/0295820 | A1* | 11/2010 | Kikin-Gil ............. G06F 3/0421 345/175 |
| 2012/0146952 | A1 | 6/2012 | Park et al. |

FOREIGN PATENT DOCUMENTS

| KR | 10-2016-0029543 | 3/2016 |
| KR | 10-2017-0129627 | 11/2017 |
| KR | 10-1791891 | 11/2017 |

OTHER PUBLICATIONS

Ig Mo KOO et al., "Development of Soft-Actuator-Based Wearable Tactile Display", IEEE Transactions on Robotics, Jun. 2008, pp. 549-558, vol. 24, No. 3.
Nadine BESSE et al., "Flexible Active Skin: Large Reconfigurable Arrays of Individually Addressed Shape Memory Polymer Actuators", Advanced Materials Technology, 2017, vol. 2, 1700102.
Somsubhra Maity et al., "Embedded metal nanoparticles as localized heat sources: An alternative processing approach for complex polymeric materials", Polymer, 2011, vol. 52, pp. 1674-1685.

* cited by examiner

FIG. 1
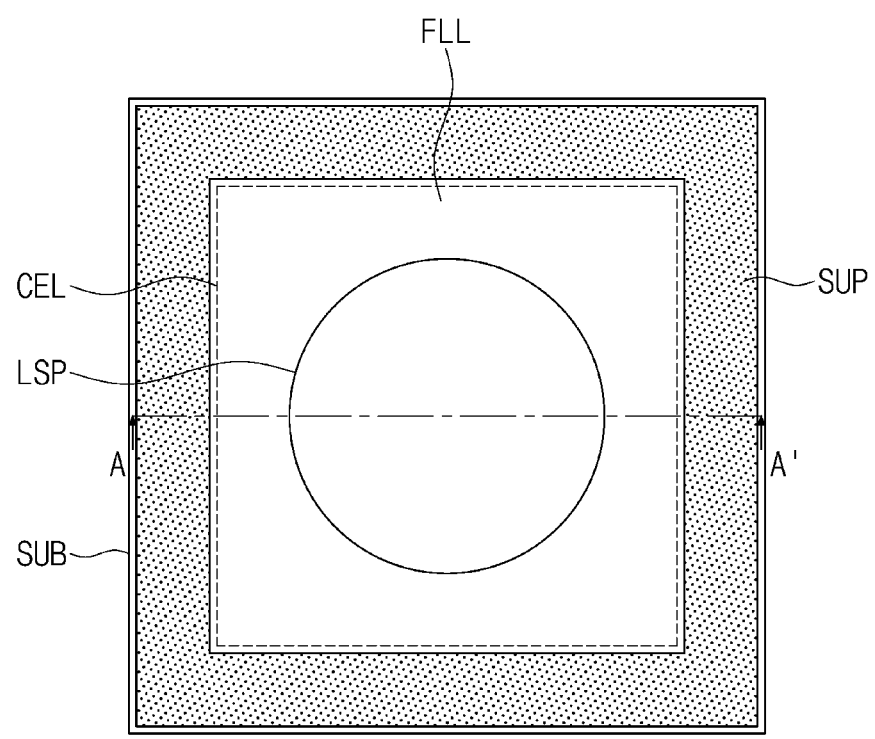
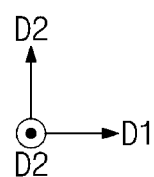

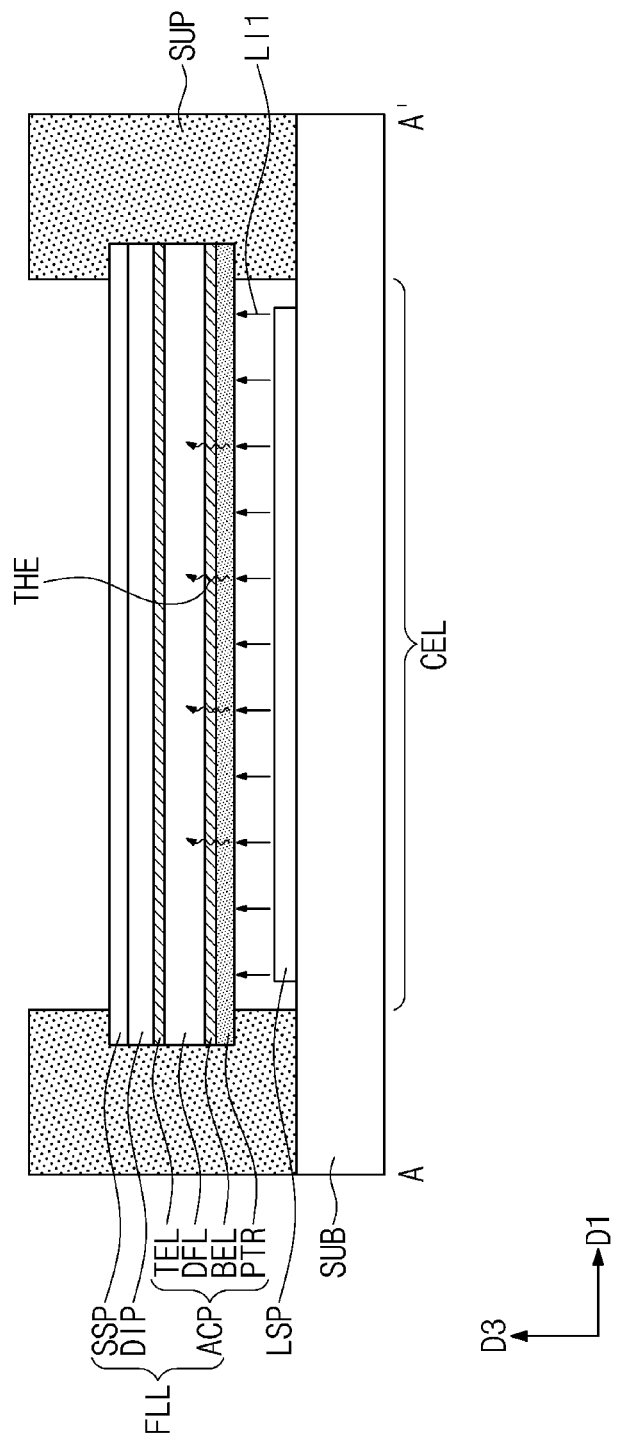

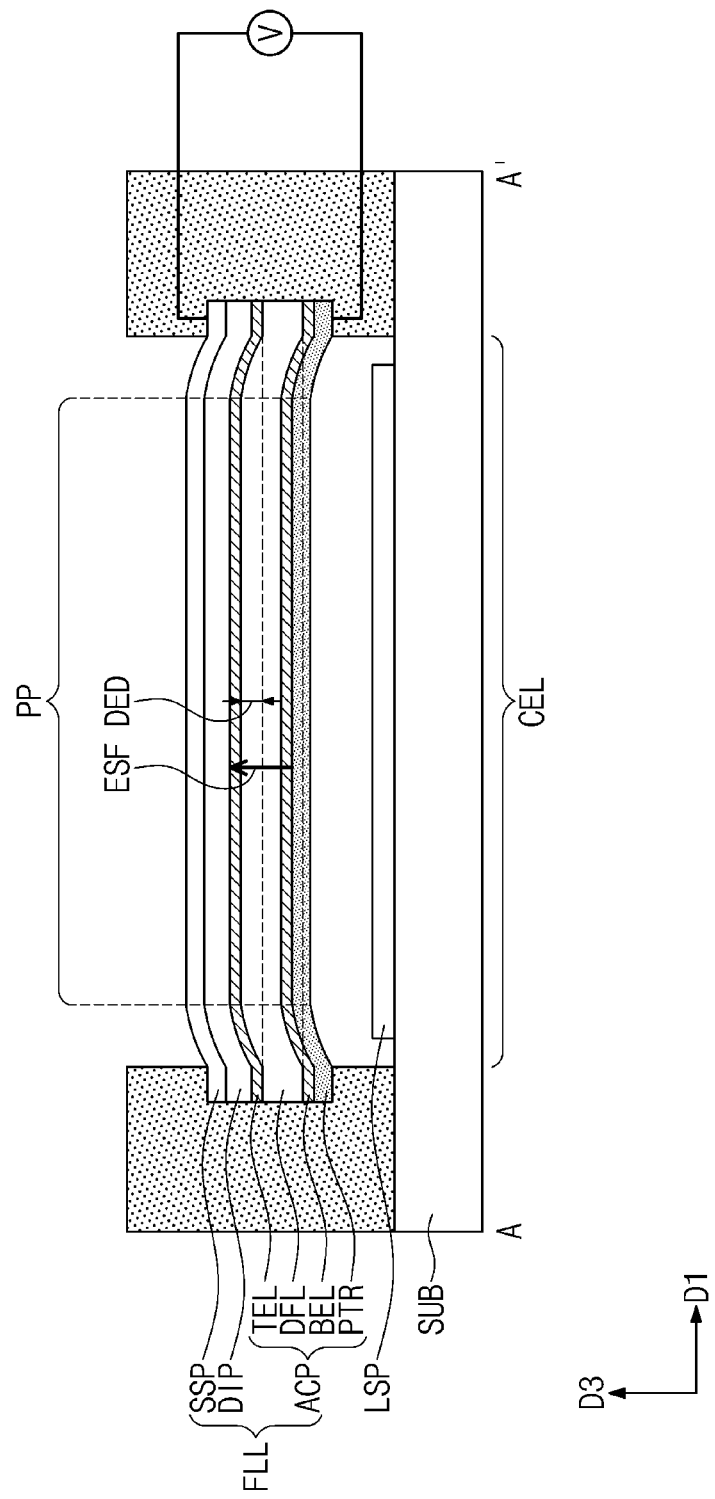

FIG. 7
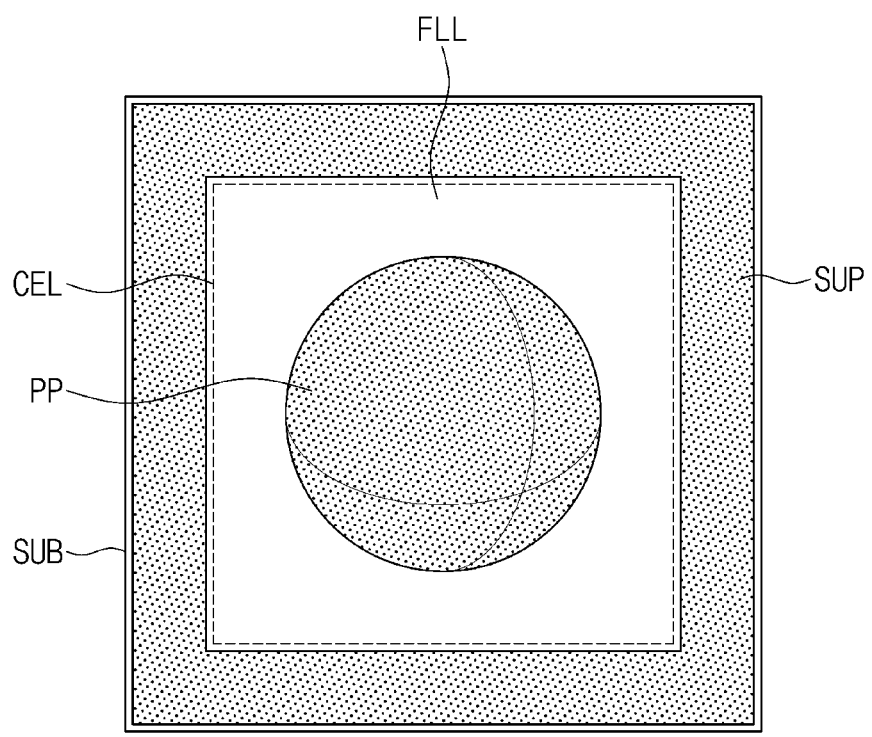
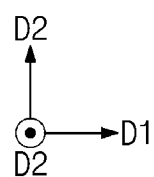

PTR

PTR
SPA

MEP3

MEP4

MEP5

SHAPE-VARIABLE ELECTRONIC DEVICE AND OPERATION METHOD OF THE SAME

CROSS-REFERENCE TO RELATED APPLICATION

This application is a national entry of International Application No. PCT/KR2020/000975, filed on Jan. 21, 2020, which claims under 35 U.S.C. § 119(a) and 365(b) priority to and benefits of Korean Patent Application Nos. 10-2019-0007798, filed on Jan. 21, 2019, and 10-2019-0163042, filed on Dec. 9, 2019 in the Korean Intellectual Property Office, the entire contents of which are hereby incorporated by reference.

TECHNICAL FIELD

The present invention relates to a shape-variable electronic device and an operation method of the same and, more specifically, to a shape-variable display and an operation method of the same.

BACKGROUND ART

Recently, due to rapid development and dissemination of electronic devices based on touch screens, a planar touch interface in connection with graphical user interface (GUI) has been popularized around the world. Most of the currently used planar touch interfaces provide only tactile feedback such that vibration is delivered to a finger of a user when the finger comes into contact with the surface.

Recently, technology for providing a feeling of clicking a button by controlling a dynamic driving signal of an actuator (for example, a motor or a voice coil) or technology for changing intensity of tactile feedback according to a contact force has been proposed.

DISCLOSURE OF THE INVENTION

Technical Problem

A problem to be solved by the present invention provides a shape-variable device capable of exhibiting excellent durability and having various shapes and color.

Another problem to be solved by the present invention provides an operation method of the shape-variable device.

Technical Solution

A shape-variable electronic device according to the concept of the present invention may include: a substrate having a cell region; a light source unit on the cell region; and a flexible layer vertically spaced apart from the light source unit. The flexible layer may include an actuator part that changes a shape of the flexible layer, and the actuator part may include: a photo-thermal response part that receives light emitted from the light source unit and generates thermal energy; a deformation part which receives the thermal energy from the photo-thermal response part and of which mechanical stiffness is reduced; and a top electrode and a bottom electrode on both surfaces of the deformation part, respectively.

A shape-variable electronic device according to another concept of the present invention may include: a substrate having a plurality of cell regions which are two-dimensionally arranged; a plurality of light source units in the plurality of cell regions, respectively; a flexible layer on the plurality of cell regions, the flexible layer extending horizontally across the plurality of cell regions; and a support unit which is on the substrate and supports the flexible layer. The flexible layer may include: a bottom electrode and a top electrode that generate electro-static force; and a deformation part between the bottom electrode and the top electrode. A shape of the deformation part may change due to light emitted from the light source units and the electro-static force.

An operation method of a shape-variable electronic device according to still another concept of the present invention may include: emitting light from a light source unit to a photo-thermal response part, wherein the photo-thermal response part receives the light and generates thermal energy; heating a deformation part by using the thermal energy, wherein the deformation part is heated to reduce mechanical stiffness thereof; and generating electro-static force between bottom and top electrodes to change a shape of the deformation part.

Advantageous Effects

The shape-variable electronic device according to the present invention may provide the relatively thin flexible layer with the various shapes and color. The tactile feedback may be provided to the flexible layer.

BRIEF DESCRIPTION OF THE DRAWINGS

FIG. 1 is a plan view for illustrating a shape-variable display according to embodiments of the present invention.

Each of FIG. 3A, FIG. 3B.

FIG. 4, FIG. 5, and FIG. 6 are cross-sectional views for illustrating operations of a shape-variable display according to embodiments of the present invention.

FIG. 7 is a plan view of a shape-variable display having a changed shape according to embodiments of the present invention.

Each of FIG. 11A, FIG. 11B.

Each of FIG. 12

Each of FIG. 21A

MODE FOR CARRYING OUT THE INVENTION

Figure 2:
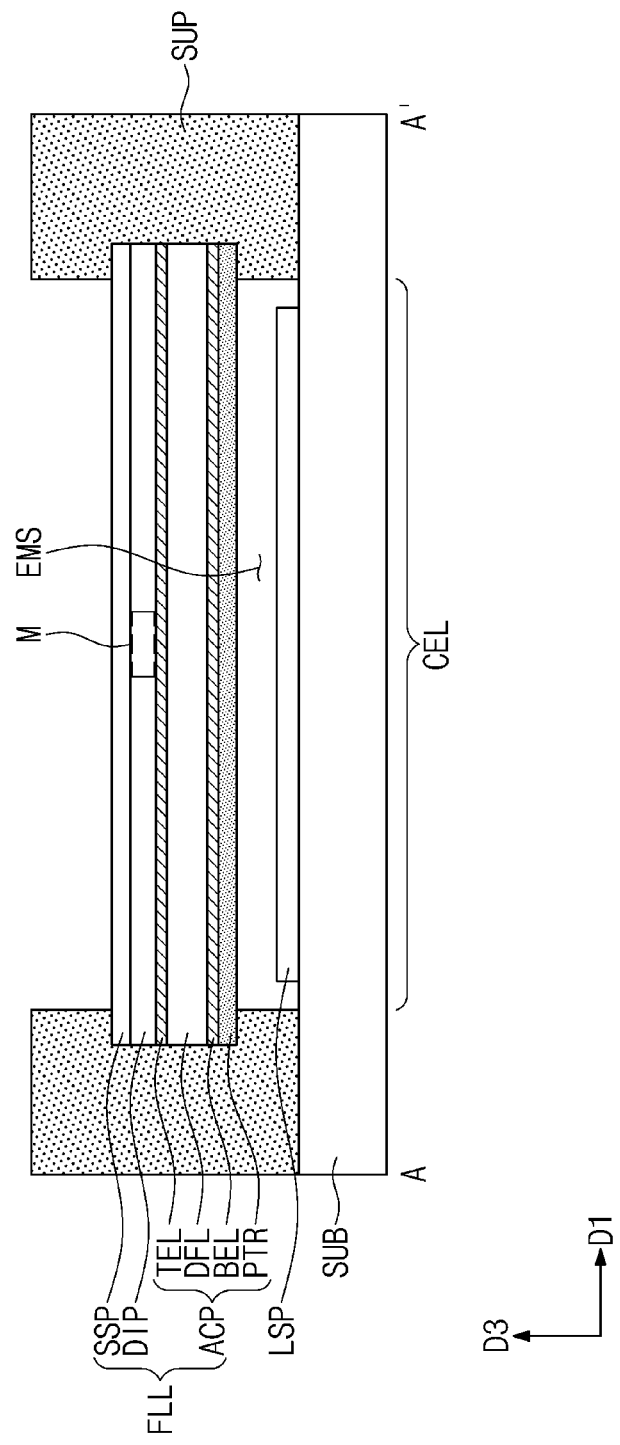
FIG. 2 is a cross-sectional view taken along line A-A' of FIG. 1.

Preferred embodiments of the present invention will be described with reference to the accompanying drawings so as to sufficiently understand constitutions and effects of the present invention. However, the present invention may be embodied in different forms with various changes, but not limited to the embodiments set forth herein. Rather, these embodiments are provided so that this disclosure will be thorough and complete, and will fully convey the scope of the present invention to a person skilled in the art to which the invention pertains.

In this specification, it will be understood that when a component is referred to as being 'on' another component, it can be directly on another component, or an intervening third component may also be present. Also, in the drawings, the thicknesses of the components are exaggerated for effectively describing the technical features. Like reference numerals refer to like elements throughout.

Although terms like a first, a second, and a third are used to describe various components in various embodiments of this specification, the components should not be limited to these terms. These terms are only used to distinguish one component from another component. Embodiments described and exemplified herein include complementary embodiments thereof.

In this specification, the terms are used only for explaining embodiments while not limiting the present invention. In this specification, the singular forms include the plural forms as well, unless the context clearly indicates otherwise. The meaning of "comprises" and/or "comprising" used in the specification does not exclude the presence or addition of one or more other components besides a mentioned component.

A shape-variable electronic device of the present invention may include various electronic devices having a flexible layer of which a shape changes. Hereinafter, as one example of a shape-variable electronic device according to embodiments of the present invention, a shape-variable display will be described in detail.

Figure 3A:
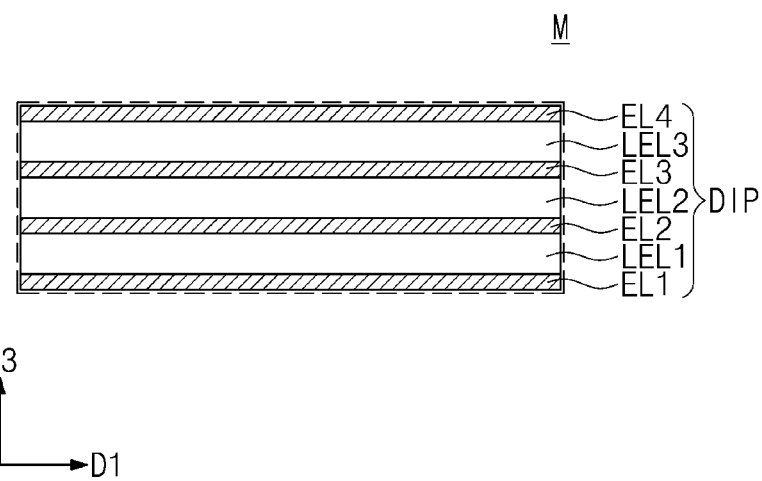
FIG. 3C is an enlarged cross-sectional view of a region of M of FIG. 2.
FIG. 3D is a cross-sectional view for illustrating one embodiment of a display part.
Figure 3B:
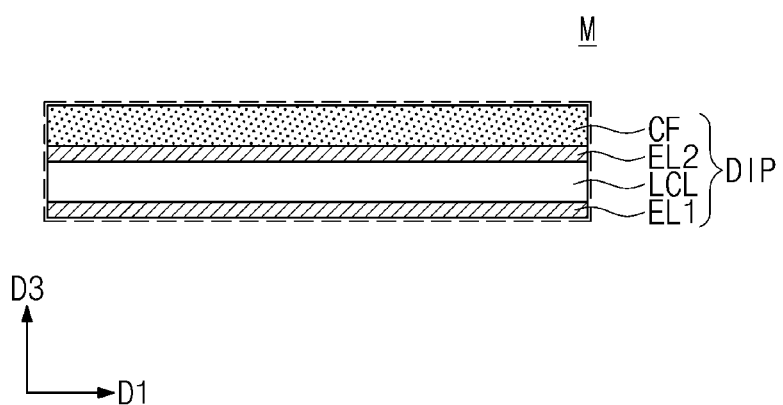
Figure 3C:
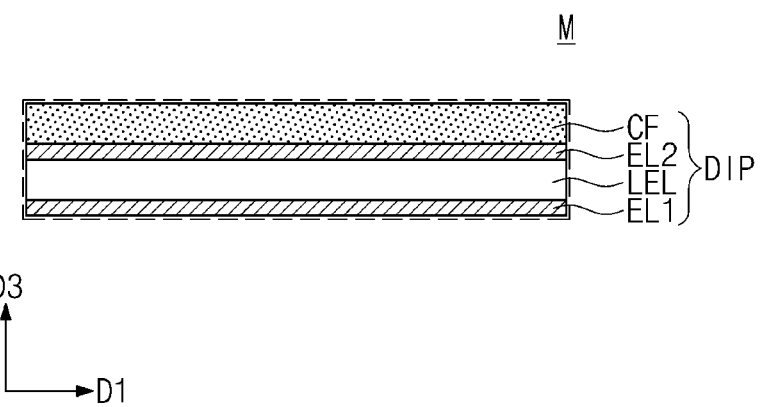
Figure 3D:
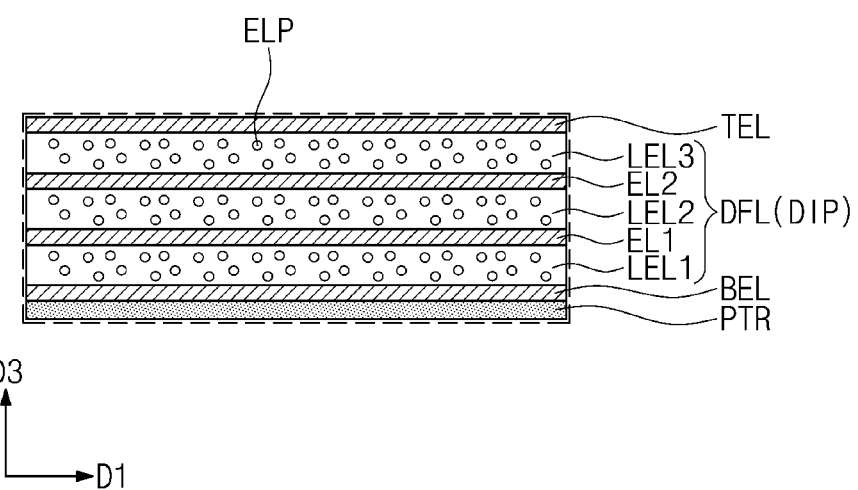

FIG. 1 is a plan view for illustrating a shape-variable display according to embodiments of the present invention. FIG. 2 is a cross-sectional view taken along line A-A' of FIG. 1. Each of FIG. 3A, FIG. 3B, and FIG. 3C is an enlarged cross-sectional view of a region of M of FIG. 2. FIG. 3D is a cross-sectional view for illustrating one embodiment of a display part.

Referring to FIG. 1 and FIG. 2, a substrate SUB having a cell region CEL may be provided. A light source unit LSP may be provided on the cell region CEL of the substrate SUB. The light source unit LSP may include an element capable of discharging light, for example, an LED or an OLED. When viewed in a plane, the light source unit LSP may be provided within the cell region CEL. The light source unit LSP may have various shapes, and is illustrated as a circular shape in FIG. 1.

As one example, the light source unit LSP may include one light emitting element (for example, an LED). As another example, the light source unit LSP may include a plurality of light emitting elements (for example, a plurality of micro-LEDs).

A support unit SUP that surrounds may be provided on the substrate SUB. A flexible layer FLL supported by the support unit SUP may be provided on the cell region CEL. When viewed in a plane, the support unit SUP may surround the flexible layer FLL. The flexible layer FLL may be spaced vertically (that is, in a third direction D3) from the light source unit LSP by the support unit SUP. The flexible layer FLL may include a plurality of laminated layers. Each of the plurality of layers constituting the flexible layer FLL may be formed of a flexible material so that the shape thereof may be deformed.

The flexible layer FLL may include an actuator part ACP, a display part DIP, and a sensor part SSP which are sequentially laminated on the light source unit LSP. Each of the actuator part ACP, the display part DIP, and the sensor part SSP according to embodiments of the present invention may be formed of a flexible material so that the shape thereof may be deformed.

The actuator part ACP may actively deform the shape of the flexible layer FLL. The actuator part ACP may be spaced apart from the light source unit LSP, in the third direction D3, by the support unit SUP. An empty space EMS may be defined between the actuator part ACP, the support unit SUP, and the light source unit LSP.

The actuator part ACP may a photo-thermal response part PTR, a bottom electrode BEL, a deformation part DFL, and a top electrode TEL. According to the present embodiment, the photo-thermal response part PTR, the bottom electrode BEL, the deformation part DFL, and the top electrode TEL may be sequentially laminated in the third direction D3.

The photo-thermal response part PTR may include a photo-thermal material that may absorb light (for example, visible light or infrared light) and generate heat. For example, the photo-thermal response part PTR may include PEDOT (poly(3,4-ethylenedioxythiophene)), PEDOT:PSS (poly(3,4-ethylenedioxythiophene)-poly(styrene sulfonate)), or PEDOT/metallic particle composite.

For example, forming the photo-thermal response part PTR may include forming a polymer film, having photo-thermal response characteristics, on the bottom electrode BEL by using a surface deposition method (for example, spray coating or spin coating).

Each of the bottom electrode BEL and the top electrode TEL may include a conductive material that may maintain conductivity even when the shape thereof is deformed. The conductive material may have bonding characteristics, that is, a tendency to be bonded to the deformation part DFL. As one example, each of the bottom electrode BEL and the top electrode TEL may include at least one of a nanowire, graphene, a carbon nanotube, flexible metal, or flexible conductive polymer.

Preferably, each of the bottom electrode BEL and the top electrode TEL may include a nanowire or a carbon nanotube that has a network structure including voids. When the bottom electrode BEL and the top electrode TEL include the nanowire or the carbon nanotube that has the network structure, the bottom electrode BEL and the top electrode TEL may be embedded within the deformation part DFL. When the bottom electrode BEL and the top electrode TEL are embedded in the deformation part DFL, the bonding characteristics between the electrodes and the deformation part DFL may be improved, and the conductivity of the electrode may hardly decrease even when the shape is repeatedly deformed.

The deformation part DFL may include a dielectric polymer layer having the bistable characteristics in which a mechanical property changes over a temperature. The deformation part DFL has the bistable characteristics and thus may have high mechanical stiffness at room temperature, but the mechanical stiffness thereof may be significantly reduced at a specific temperature or higher. That is, the deformation part DFL may be rigid at the room temperature, and the deformation part DFL may become flexible at the specific temperature or higher.

A term "mechanical stiffness" used in the present invention may be a value obtained by measuring resistance of the deformation part DFL against shape deformation. For example, referring to FIG. 5, the mechanical stiffness may be expressed by the ratio (ESF/DED) of an electro-static force ESF to a protrusion distance DED of the deformation part DFL in a third direction D3 when the electro-static force ESF is applied to the deformation part DFL in the third direction D3.

When the deformation part DFL is not deformed at all even though the electro-static force ESF is applied in the third direction D3, the protrusion distance DED is zero. Thus, in this case, the value of the mechanical stiffness of the deformation part DFL may be very large, such as infinity.

When the deformation part DFL is curved in the third direction D3 due to the electro-static force ESF applied in the third direction D3, the protrusion distance DED may have a specific value. In this case, the value of the mechanical stiffness may be significantly reduced when compared to the above-described case in which the protrusion distance DED is zero.

The deformation part DFL may include shape memory polymer. For example, the shape memory polymer may be selected from the group consisting of PTBA (poly(tert-butyl acrylate)), tert-butyl acrylate copolymer, and stearyl acrylate polymer.

The display part DIP on the actuator part ACP may output graphical user interface. Particularly, the display part DIP may emit light having a specific wavelength (for example, visible light). The display part DIP may include at least one pixel. According to another embodiment of the present invention, the display part DIP may be omitted in a case in which a shape-variable electronic device is not required to have a display function. For example, when the electronic device according to the present invention is used in a braille apparatus for the blind, the display part DIP may be omitted.

Referring to FIG. 3A, a display part DIP according to one embodiment of the present invention will be described in more detail. The display part DIP may include first to fourth electrodes EL1 to EL4 and first to third light emitting layers LEL1 to LEL3 disposed therebetween. The first to fourth electrodes EL1 to EL4 and the first to third light emitting layers LEL1 to LEL3 are alternately laminated on each other.

The first to third light emitting layers LEL1 to LEL3 may emit light having specific wavelengths. As one example, the first to third light emitting layers LEL1 to LEL3 may emit red light, green light, and blue light, respectively. The display part DIP may display desired color by the combination of the first to third light emitting layers LEL1 to LEL3.

Each of the first to third light emitting layers LEL1 to LEL3 may include an electroluminescence material. As one example, each of the first to third light emitting layers LEL1 to LEL3 may include a sulfide-based electroluminescence material or a selenide-based electroluminescence material dispersed in flexible polymer. As another example, the first to third light emitting layers LEL1 to LEL3 may include an OLED such as a polymer LED. As still another example, each of the first to third light emitting layers LEL1 to LEL3 may include electroluminescence quantum dots dispersed in flexible polymer.

Referring to FIG. 3B, a display part DIP according to another embodiment of the present invention will be described in more detail. The display part DIP may include first and second electrodes EL1 and EL2, and a light emitting layer LEL disposed therebetween. The display part DIP may further include a color filter CF on the second electrode EL2. The light emitting layer LEL may be the same as one of the first to third light emitting layers LEL1 to LEL3 described above with reference to FIG. 3A. As one example, the color filter CF may include a quantum dot within flexible polymer. The display part DIP may display desired color through the color filter CF.

Referring to FIG. 3C, a display part DIP according to still another embodiment of the present invention will be described in more detail. The display part DIP may include first and second electrodes EL1 and EL2, and a liquid crystal layer LCL disposed therebetween. The display part DIP may further include a color filter CF on the second electrode EL2. When voltages different from each other are applied by the first and second electrodes EL1 and EL2, liquid crystals of the liquid crystal layer LCL are arranged in one direction, and thus the transmittance may increase. Therefore, light emitted from the light source unit LSP may pass through the actuator part ACP and the liquid crystal layer LCL. As the light passes through the color filter CF, the display part DIP may display desired color.

Referring to FIG. 3D, a display part DIP according to still another embodiment of the present invention will be described in more detail. The display part DIP may be formed within the deformation part DFL. Particularly, a deformation part DFL may include first to third light emitting layers LEL1 to LEL3 in which electroluminescence particles ELP are dispersed. The light emitting layers LEL1 to LEL3 may be constituted by dispersing the electroluminescence particles ELP into shape memory polymer layers. The deformation part DFL may further include a first electrode EL1 between the first and second light emitting layers LEL1 and LEL2 and a second electrode EL2 between the second and third light emitting layers LEL2 and LEL3. The deformation part DFL according to the present embodiment may actively deform the shape of the flexible layer FLL and perform a display function.

Referring to FIG. 1 and FIG. 2 again, the sensor part SSP may receive information from a user. Particularly, the sensor part SSP may include a touch sensor capable of recognizing a touch of the user. For example, the sensor part SSP may include a pressure sensor capable of sensing pressure that is applied on a predetermined region.

According to another embodiment of the present invention, the sensor part SSP may be omitted in a case in which a shape-variable electronic device is not required to have a function of receiving the information from the user. For example, when the electronic device according to the present invention is used in a digital wall for advertising a product, the sensor part SSP may be omitted.

Although not shown, the shape-variable display according to embodiments of the present invention may further include a signal control module. The signal control module may be connected to the light source unit LSP, the actuator part ACP, the display part DIP, and the sensor part SSP. The signal control module may control operations of the light source unit LSP, the actuator part ACP, and the display part DIP. The signal control module may receive a signal from the sensor part SSP and provide feedback.

Figure 6:
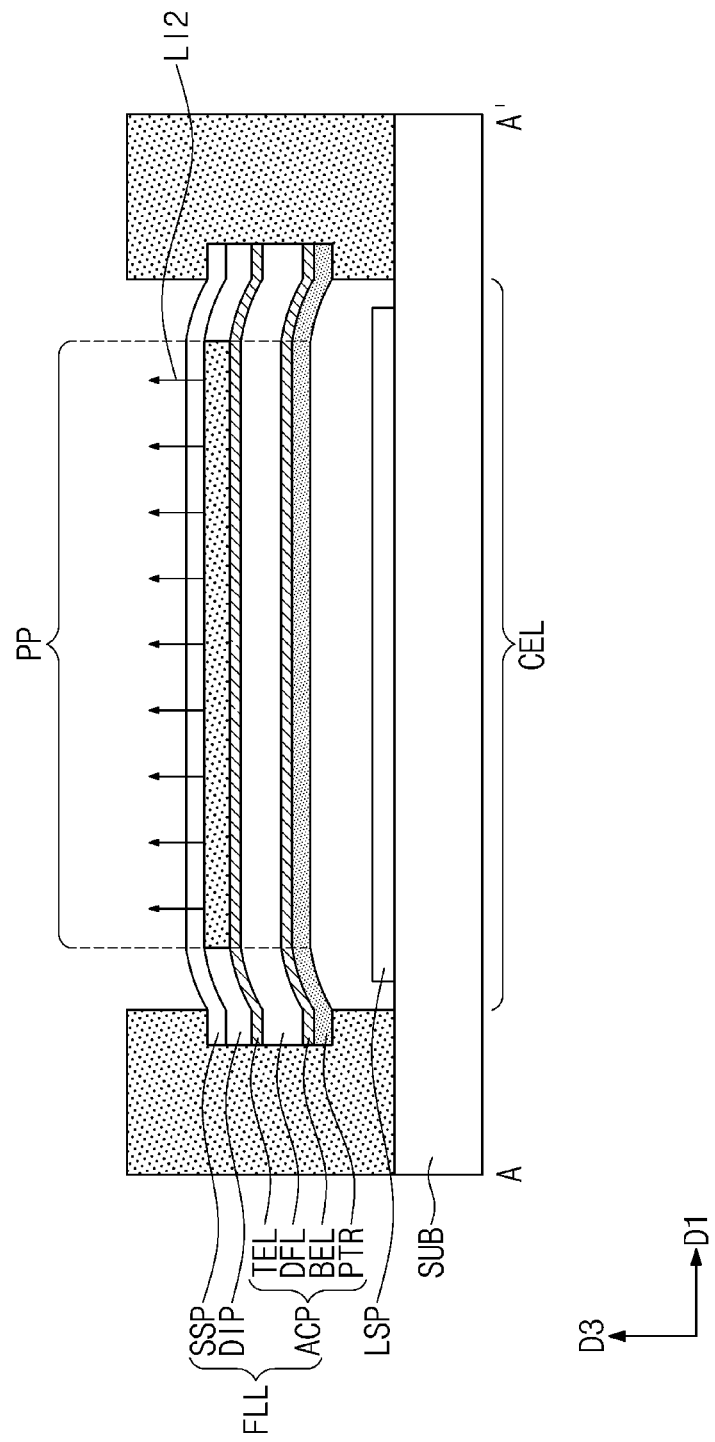

FIG. 4, FIG. 5, and FIG. 6 are cross-sectional views for illustrating operations of a shape-variable display according to embodiments of the present invention. FIG. 7 is a plan view of a shape-variable display having a changed shape according to embodiments of the present invention.

Referring to FIG. 4, first light LI1 may be emitted from a light source unit LSP, and generate to a photo-thermal response part PTR. The photo-thermal response part PTR may generated thermal energy THE in response to the incident first light LI1. The thermal energy THE generated from the photo-thermal response part PTR may be transferred to a deformation part DFL.

A temperature of the deformation part DFL may increase due to the thermal energy THE. As the temperature of the deformation part DFL increases to a specific temperature or higher, mechanical stiffness of the deformation part DFL may be reduced. That is, the deformation part DFL that is rigid may be changed to be flexible.

Referring to FIG. 5, when voltage is applied on the lower electrode BEL and a top electrode TEL, an electro-static force may be generated therebetween. Due to an electro-static force ESF in a third direction D3, a shape of the flexible deformation part DFL may change. For example, buckled deformation in the third direction D3 may occur in the deformation part DFL.

According to another embodiment of the present invention, the deformation part DFL that becomes flexible may be deformed by supplying pressure of air, gas, and fluid instead of the electro-static force. That is, by adding a device capable of applying hydraulic pressure or pneumatic pressure on the deformation part DFL, the deformation part DFL may be deformed using that device.

Referring to FIG. 5 and FIG. 7, as the shape of the deformation part DFL changes, a protrusion region PP protruding in the third direction D3 is formed in a flexible layer FLL. The protrusion region PP may have a circular button shape corresponding to a planar shape of the light source unit LSP.

When the temperature of the deformation part DFL decreases to the specific temperature or lower after the deformation part DFL is deformed by the electro-static force, the deformation part DFL may become rigid while maintaining the deformed shape. Therefore, even though the voltage is not applied to the bottom electrode BEL and the top electrode TEL any more, the flexible layer FLL may maintain the deformed shape (the protruding button shape) as it is. That is, although the voltage is not applied to the bottom electrode BEL and the top electrode TEL, the protrusion region PP of the flexible layer FLL may be maintained as it is.

Referring to FIG. 6 and FIG. 7, second light LI2 may be emitted from a display part DIP. The second light LI2 may have a specific wavelength (for example, specific color). The protrusion region PP may have specific color through the second light LI2 emitted from the display part DIP. When a user touches the protrusion region PP, a sensor part SSP may recognize the touch and transmit a signal to a signal control module.

A method for restoring the shape-variable display to the initial state illustrated in FIG. 4 will be described additionally. As illustrated above with reference to FIG. 4, the deformation part DFL may be made flexible by heating the deformation part DFL through the light source unit LSP.

The shape of the flexible deformation part DFL may be made to change by applying voltage to the bottom electrode BEL and the top electrode TEL in the opposite manner to that illustrated above in FIG. 5. For example, when the deformation part DFL include polar polymer or ions, the polar polymer or ions move in a direction opposite to the third direction D3, and thus the deformation part DFL may be restored to the shape illustrated in FIG. 4.

When the temperature of the deformation part DFL decreases to the specific temperature or lower after the flexible layer FLL is restored to the shape illustrated in FIG. 4, the flexible layer FLL may be rigid while maintaining the restored shape.

The shape-variable display according to embodiments of the present invention does not heat the deformation part DFL by a joule heating method, but may heat the deformation part DFL by a photo-thermal response method. Therefore, the entire deformation part DFL may be uniformly heated in a short time. Also, since a joule heating electrode is not used according to embodiments of the present invention, the electrodes are not damaged, and thus the excellent durability may be obtained.

According to embodiments of the present invention, since the deformation part DFL has the bistable characteristics, the deformation of the flexible layer FLL may be maintained as it is even though the voltage is not consistently applied to the bottom electrode BEL and the top electrode TEL when the deformation part DFL becomes rigid after the shape of the deformation part DFL is deformed. Thus, the power consumption of display elements may be improved.

According to embodiments of the present invention, the protrusion region PP is formed in the flexible layer FLL, and the protrusion region PP may have the specific color. For example, in the present invention, a button having an existing analog shape may be formed on the display. A user recognizes the protrusion region PP visually and tactually, and may input information to the electronic device of the present invention by pushing the protrusion region.

According to embodiments of the present invention, the actuator part ACP does not use a mechanical driving part, and thus may have a thin structure. That is, the actuator part ACP may be miniaturized.

As a shape-variable electronic device according to a comparative example of the present invention, there is a device in which vibration tactility is provided from a flexible touch interface by using a polymer active material-based flexible actuator. There is also a device in which a flexible polymer thin film is deformed by using hydraulic pressure or pneumatic pressure, or a device in which Joule heating and a mechanical property variable material are combined.

However, in a case in which the vibration tactility is provided by using the shape deformation of the polymer material, deterioration in vibration tactility occurs due to material flexibility. In a case of technology in which the hydraulic pressure or pneumatic pressure is used, it is difficult to miniaturize a device due to a hydraulic pressure supply part or a pneumatic pressure supply part. In technology in which Joule heating is used, a change in electrical resistance occurs due to the force applied to the joule heating electrode, and thus the durability of the electrode may be deteriorated. Also, when the polymer material is heated through Joule heating, it is difficult to uniformly heat the material in a short time. A temperature deviation of the material may cause non-uniformity in shape deformation.

On the other hand, the shape-variable electronic device according to the present invention changes the mechanical property of the material on the basis of the photo-thermal response, and thus the material may be heated rapidly and uniformly. Also, the device has the excellent durability, and may be miniaturized. In addition, the shape-variable device according to the present invention may provide the various shapes and color, and thus may be applied to a shape-variable input apparatus for vehicles/mobile devices, a braille display for the blind, an educational textbook for tangible interaction, or a museum relic experience-type apparatus.

Figure 8:
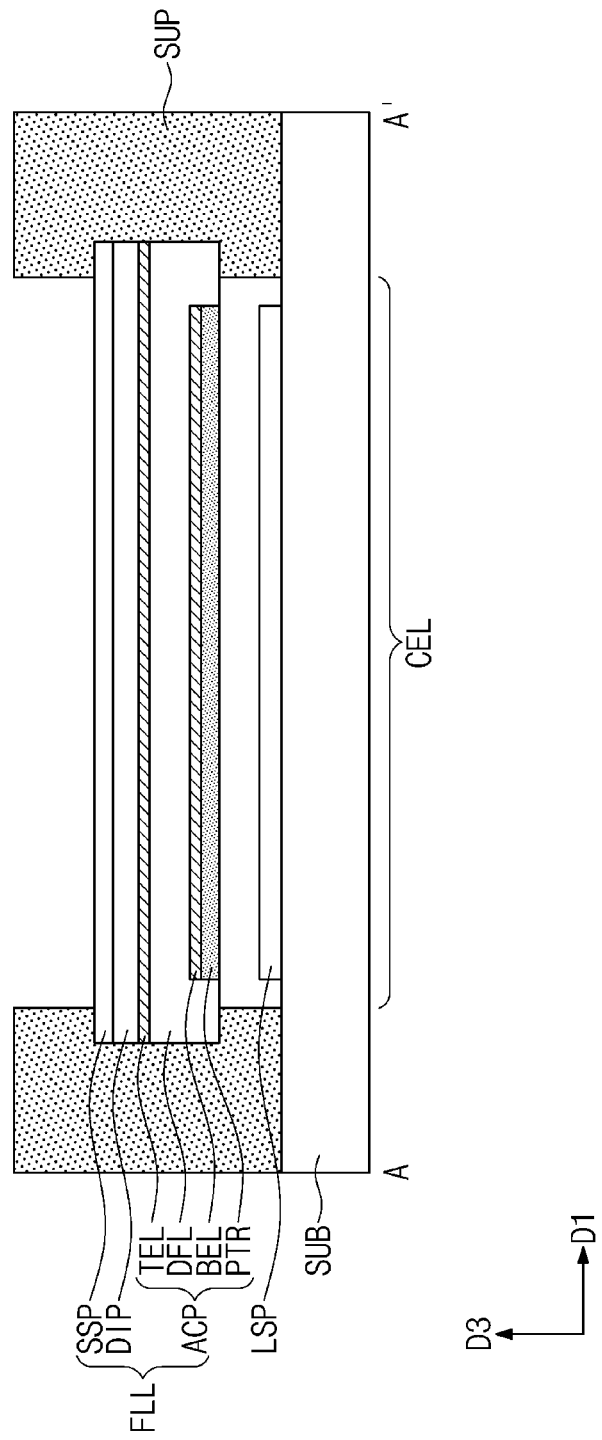
FIG. 8 is a cross-sectional view taken along line A-A' of FIG. 1 for illustrating a shape-variable display according to another embodiment of the present invention.
Figure 9A:
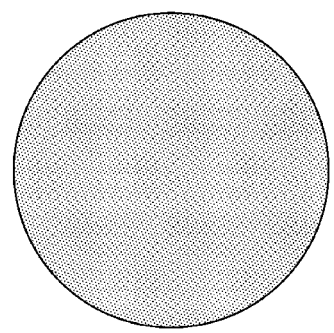
FIG. 9A and FIG. 9B are plan views of a photo-thermal response part according to a first embodiment of the present invention.
Figure 9B:
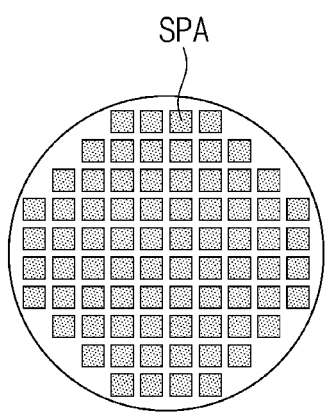
Figure 10A:
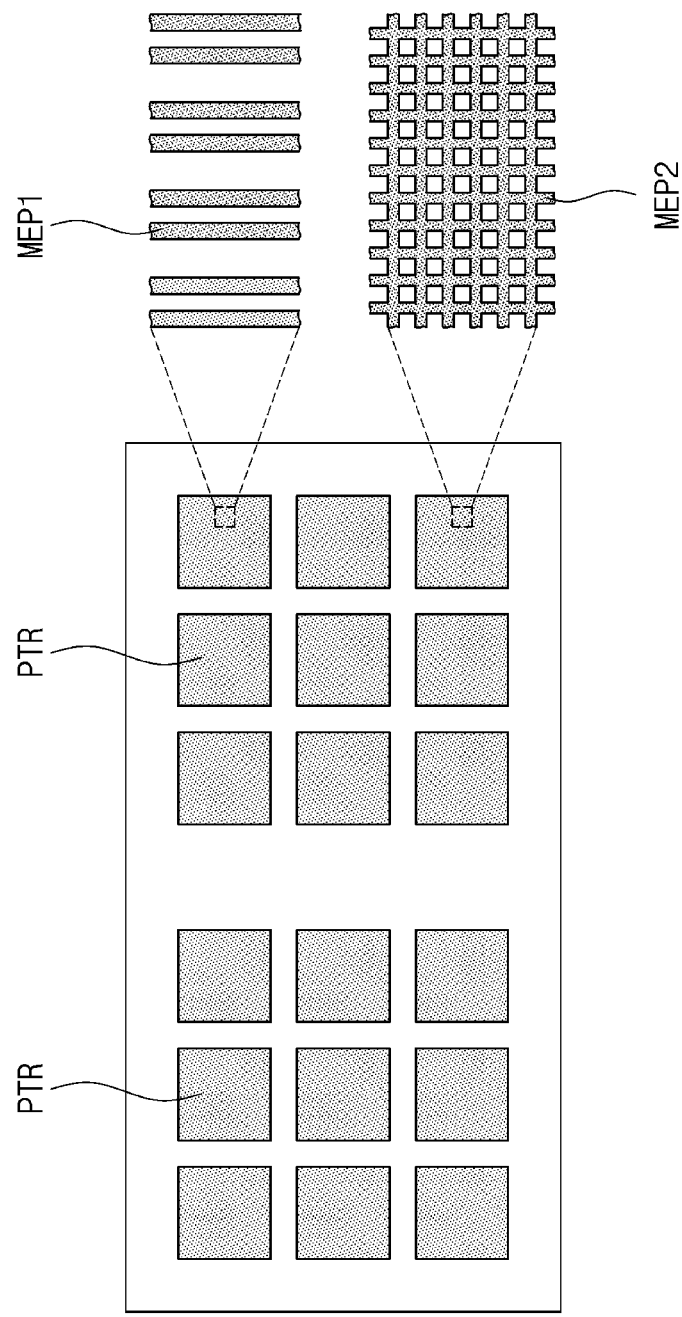
FIG. 10A and FIG. 10B are plan views of a photo-thermal response part according to a second embodiment of the present invention.
Figure 10B:
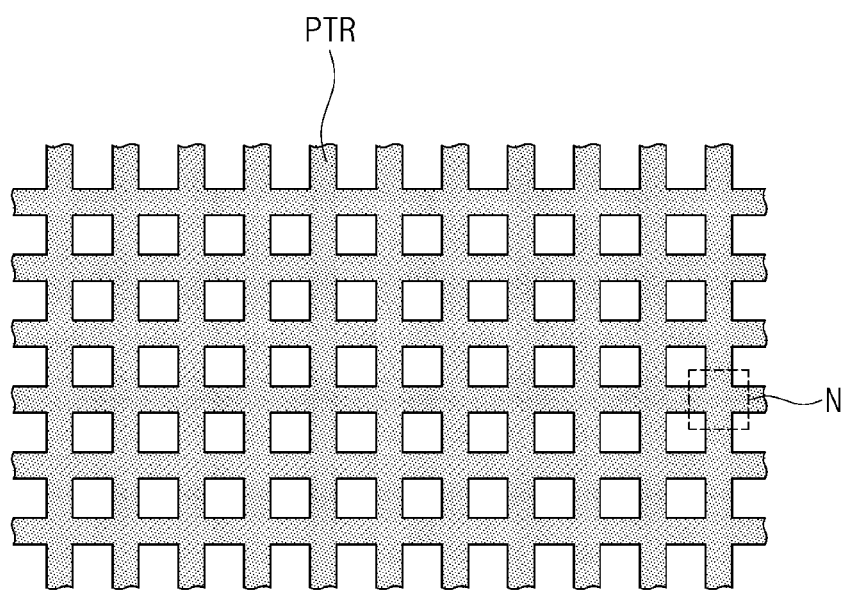
Figure 11A:
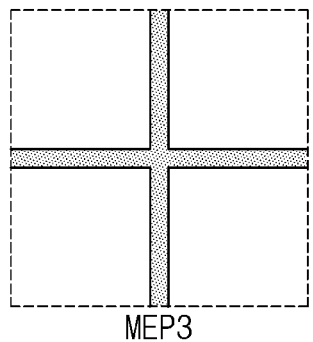
FIG. 11C is an enlarged plan view of a region of N of FIG. 10B.
Figure 11B:
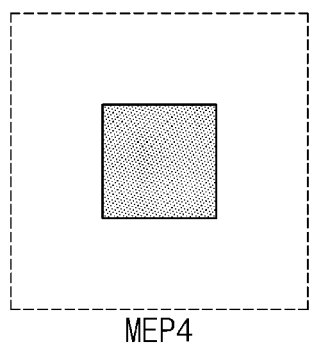
Figure 11C:
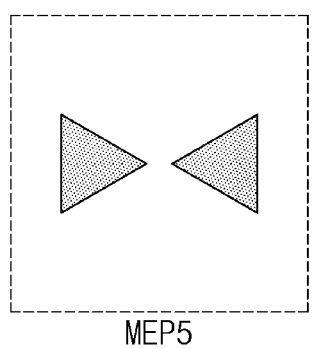
Figure 12:
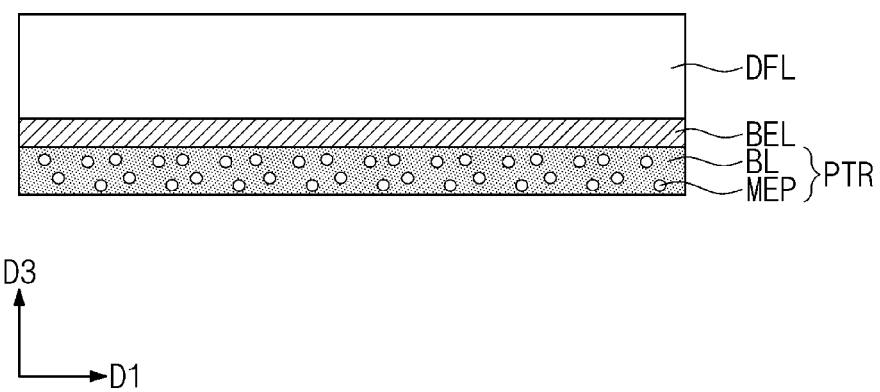
Figure 13:
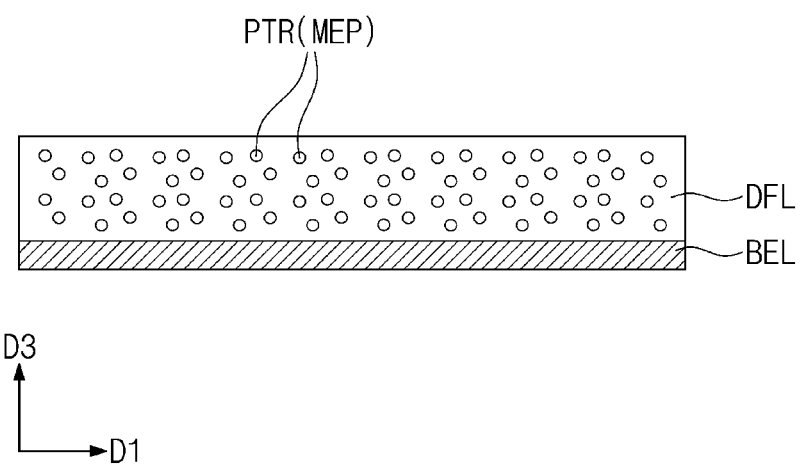
FIG. 13 is a cross-sectional view of a photo-thermal response part according to a third embodiment of the present invention.

FIG. 8 is a cross-sectional view taken along line A-A' of FIG. 1 for illustrating a shape-variable display according to another embodiment of the present invention. FIG. 9A and FIG. 9B are plan views of a photo-thermal response part according to a first embodiment of the present invention. FIG. 10A and FIG. 10B are plan views of a photo-thermal response part according to a second embodiment of the present invention. Each of FIG. 11A, FIG. 11B, and FIG. 11C is an enlarged plan view of a region of N of FIG. 10B. Each of FIG. 12 and FIG. 13 is a cross-sectional view of a photo-thermal response part according to a third embodiment of the present invention. In the present embodiments, descriptions of technical features duplicated with those described above with reference to FIG. 1 and FIG. 2 will be omitted, and the difference will be described in detail.

Referring to FIG. 8, FIG. 9A, and FIG. 9B, the photo-thermal response part PTR may include the polymer-based photo-thermal material described above. The photo-thermal response part PTR may be embedded within a deformation part DFL by using a transfer process. For example, the bottom surface of the photo-thermal response part PTR may be coplanar with the bottom surface of the deformation part DFL.

As one example, the photo-thermal response part PTR may be formed having the same planar shape as a light source unit LSP as illustrated in FIG. 9A. The photo-thermal response part PTR may be formed having one circular shape.

As another example, a photo-thermal response part PTR may include a plurality of quadrangular patterns SPA as illustrated in FIG. 9B. One photo-thermal response part PTR may be constituted by arranging the plurality of patterns SPA in a certain shape.

Referring to FIGS. 10A, 10B, 11A, 11B, and 11C, a photo-thermal response part PTR may include metallic patterns having a meta-structure. The metallic patterns of the photo-thermal response part PTR may have a pattern shape (that is, the meta-structure) capable of absorbing the wavelength of light emitted from the light source unit LSP. The metallic patterns of the photo-thermal response part PTR may be formed on the deformation part DFL by using a photolithography process. The metallic patterns of the photo-thermal response part PTR may be embedded within the deformation part DFL.

Referring to FIG. 10A, the metallic patterns may have one dimensional arrangement such as a first metallic pattern MEP1 or two-dimensional arrangement of a grid shape such as a second metallic pattern MEP2.

Referring to FIG. 10B, the metallic pattern having the arrangement of the grid shape such as the second metallic pattern MEP2 described above may be composed of fine patterns illustrated in FIG. 11A to FIG. 11C. A fine pattern MEP3 of FIG. 11A has a wire grid shape, a fine pattern MEP4 of FIG. 11B has a quadrangular patch shape, and a fine pattern MEP5 of FIG. 11C has a taper shape.

Referring to FIG. 12, the photo-thermal response part PTR may include a flexible base layer BL and metallic particles MEP dispersed within the flexible layer. The photo-thermal response part PTR according to the present embodiment may convert the light emitted from the light source unit LSP into the thermal energy by using surface plasmon resonance of the dispersed metallic particles MEP. A material, size, shape, and density of the metallic particles MEP may be adjusted so that a wavelength generating the surface plasmon resonance matches a wavelength of the light emitted from the light source unit LSP.

Referring to FIG. 13, a photo-thermal response part PTR may include metallic particles MEP dispersed within a deformation part DFL. That is, the base layer BL of FIG. 12 may be omitted. The metallic particles MEP are dispersed within the deformation part DFL, and may absorb the light of the light source unit LSP and directly heat the deformation part DFL.

Figure 14:
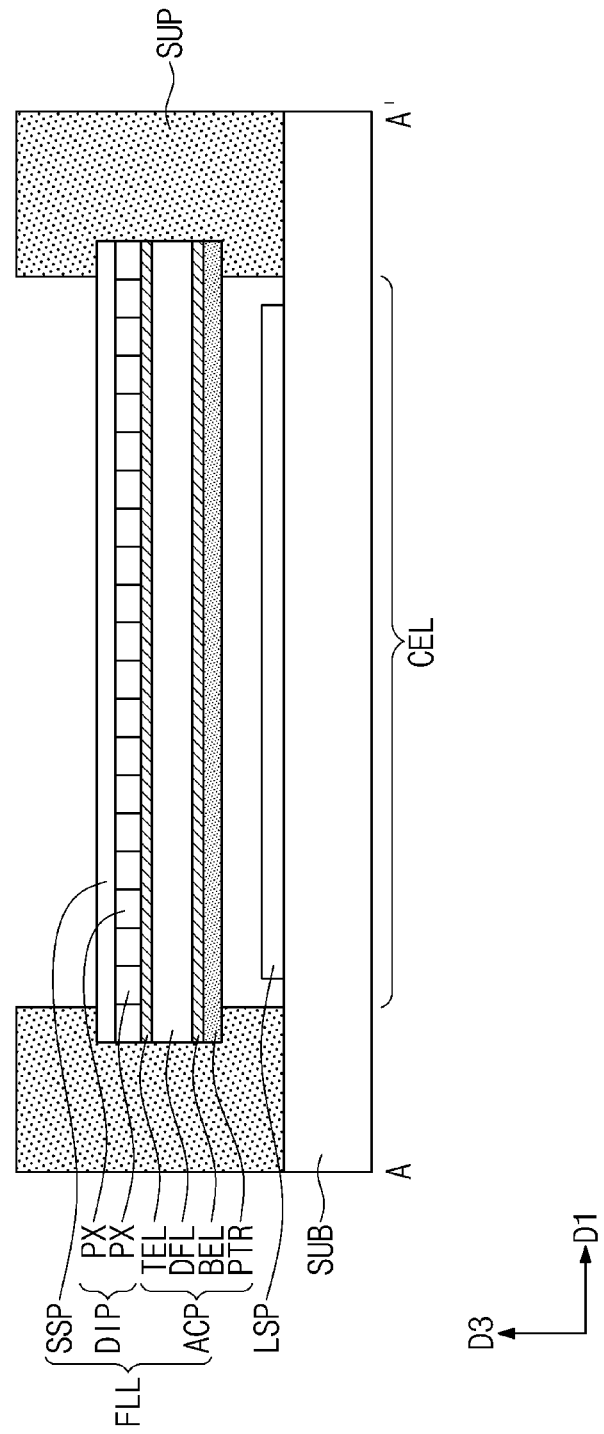
FIG. 14 is a cross-sectional view taken along line A-A' of FIG. 1 for illustrating a shape-variable display according to still another embodiment of the present invention.
Figure 15:
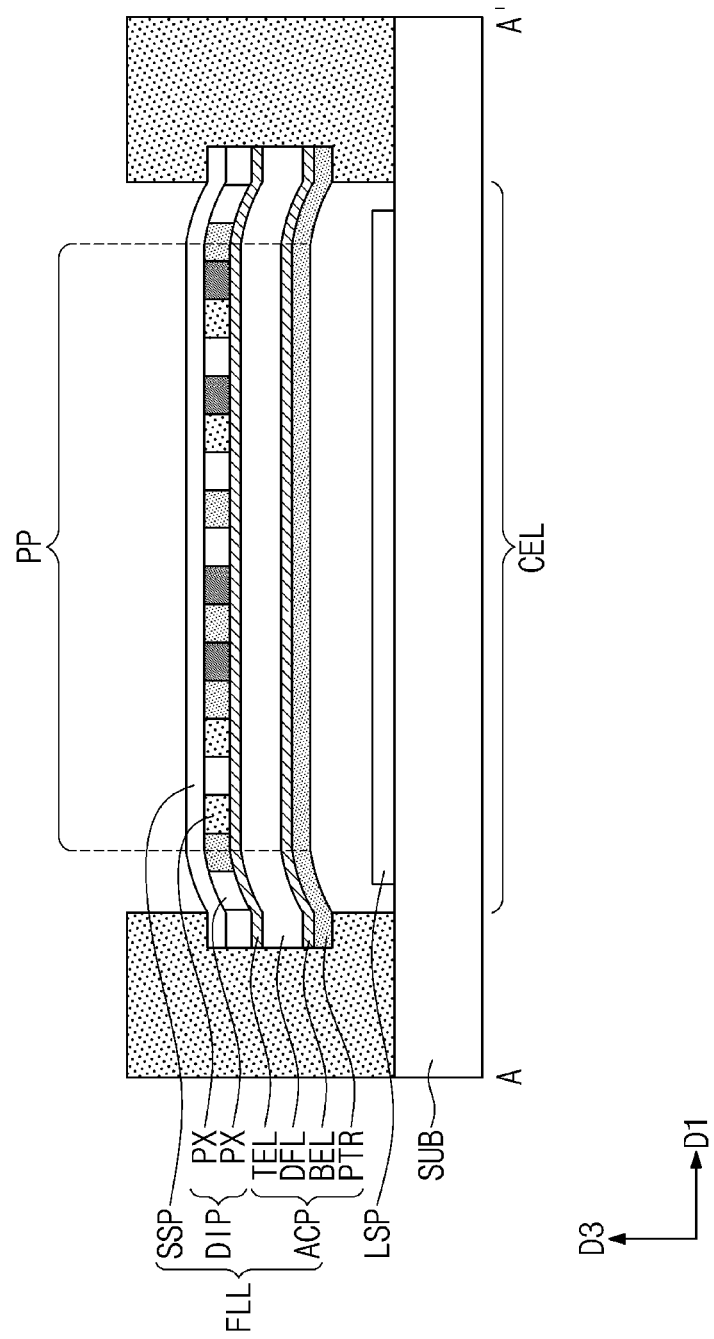
FIG. 15 is a cross-sectional view for illustrating an operation of the shape-variable display of FIG. 14.

FIG. 14 is a cross-sectional view taken along line A-A' of FIG. 1 for illustrating a shape-variable display according to still another embodiment of the present invention. FIG. 15 is a cross-sectional view for illustrating an operation of the shape-variable display of FIG. 14. In the present embodiment, descriptions of technical features duplicated with those described above with reference to FIG. 1 and FIG. 2 will be omitted, and the difference will be described in detail.

Referring to FIG. 14, a display part DIP on one cell region CEL may include a plurality of pixels PX. That is, the display part DIP may include a pixel array.

Referring to FIG. 15, in a protrusion region PP formed as a flexible layer FLL is deformed, the pixels PX of the display part DIP may emit light having different color. Since the pixels PX of the display part DIP produce different color, a specific image may be output on the protrusion region PP.

Figure 16:
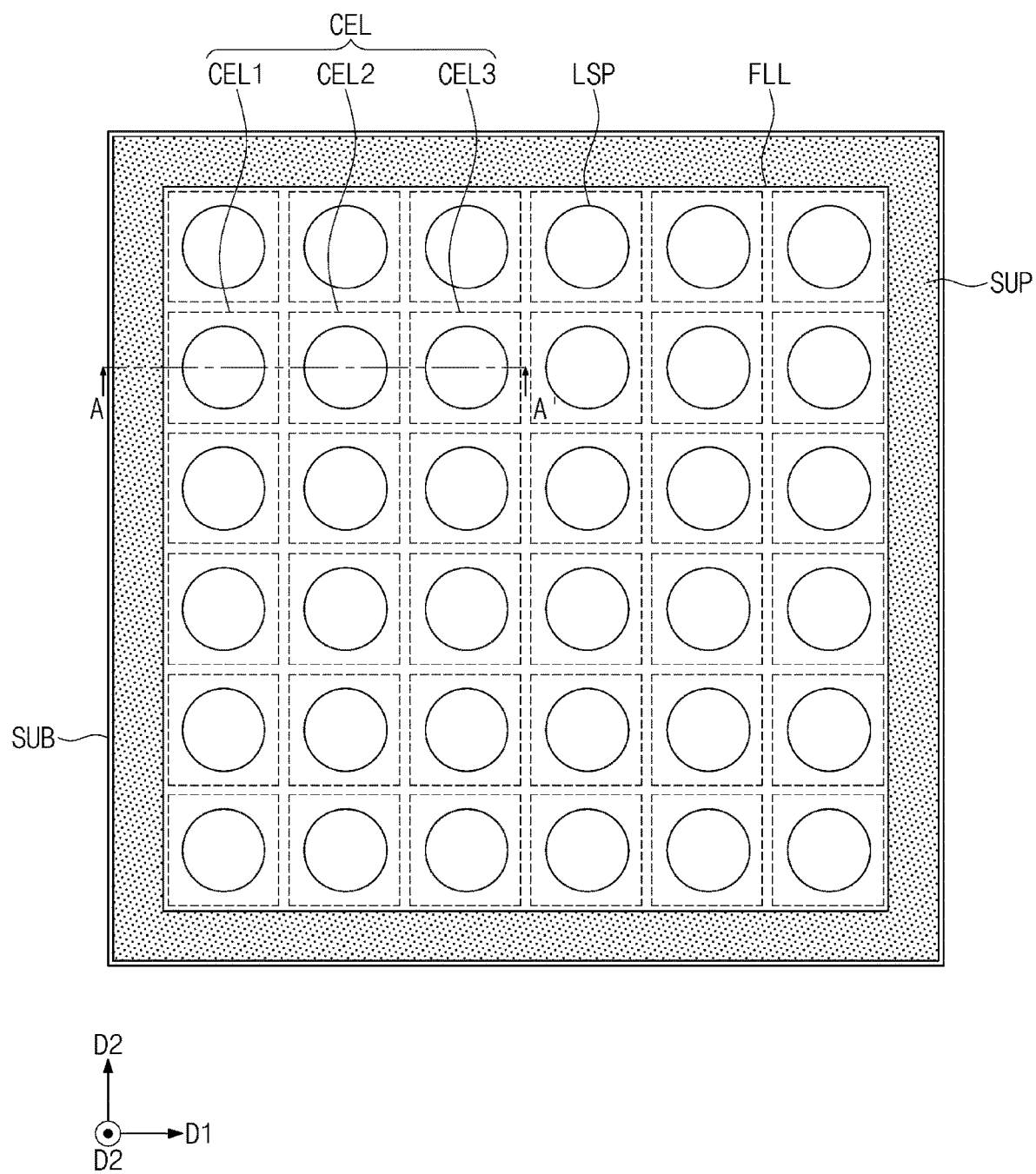
FIG. 16 is a plan view for illustrating a shape-variable display according to still another embodiment of the present invention.
Figure 17:
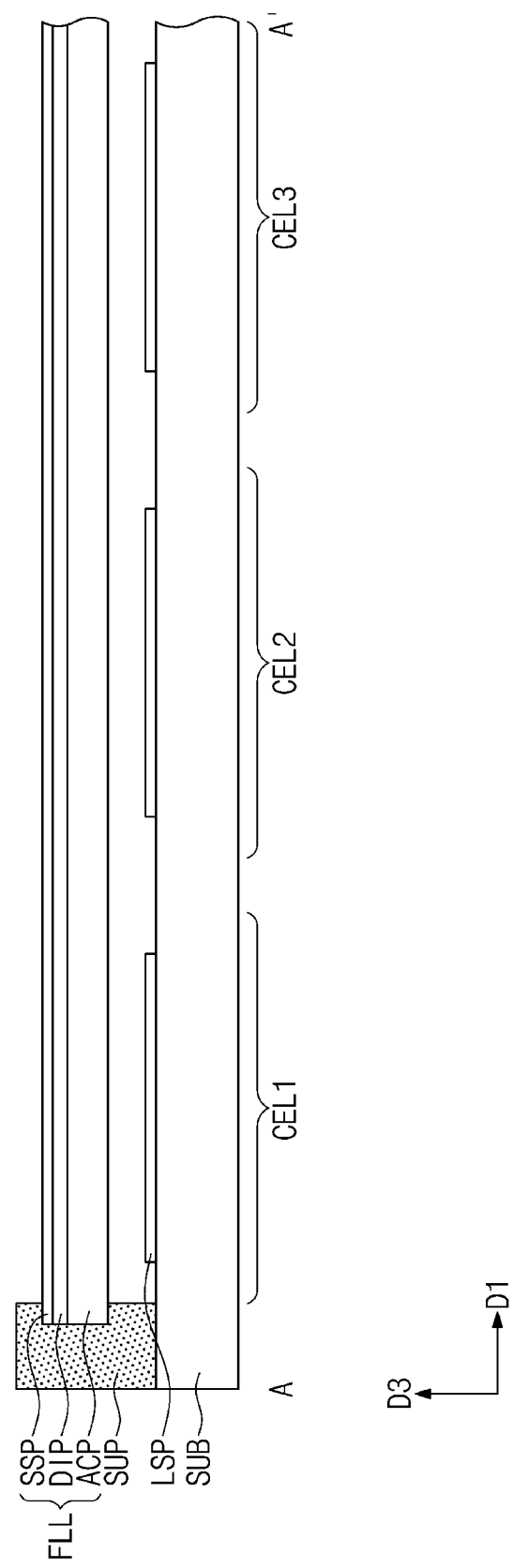
FIG. 17 is a cross-sectional view taken along line A-A' of FIG. 16.
Figure 18:
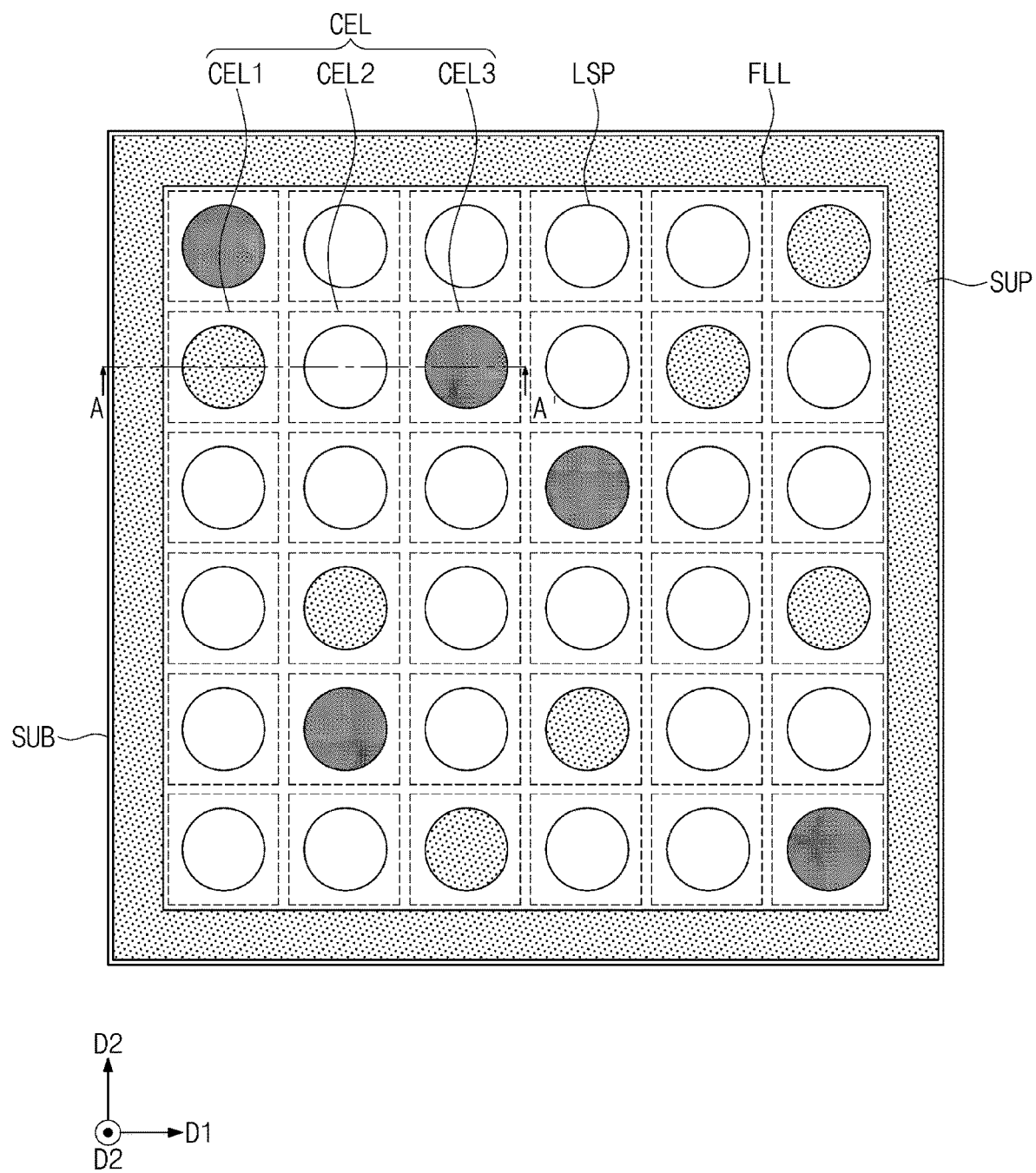
FIG. 18 is a plan view for illustrating an operation of the shape-variable display of FIG. 16.
Figure 19:
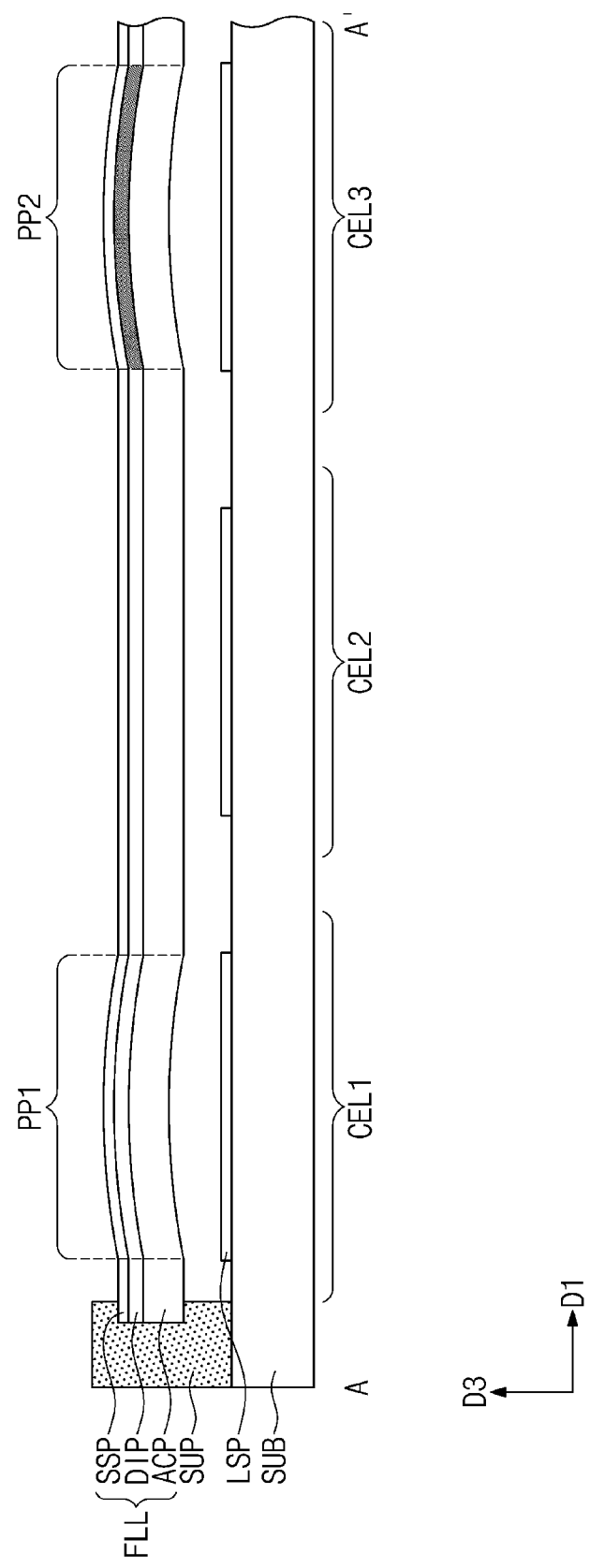
FIG. 19 is a cross-sectional view taken along line A-A' of FIG. 18.

FIG. 16 is a plan view for illustrating a shape-variable display according to still another embodiment of the present invention. FIG. 17 is a cross-sectional view taken along line A-A' of FIG. 16. FIG. 18 is a plan view for illustrating an operation of the shape-variable display of FIG. 16. FIG. 19 is a cross-sectional view taken along line A-A' of FIG. 18. In the present embodiment, descriptions of technical features duplicated with those described above with reference to FIG. 1 to FIG. 6 will be omitted, and the difference will be described in detail.

Referring to FIG. 16 and FIG. 17, a substrate SUB having a plurality of cell regions CEL may be provided. The cell regions CEL may be two-dimensionally arranged along a first direction D1 and a second direction D2. The cell regions CEL may constitute a two-dimensional array. For example, the cell regions CEL may include first, second, and third cell regions CEL1, CEL2, and CEL3 which are arranged side by side in the first direction D1.

Light source units LSP may be provided on the cell regions CEL, respectively. As one example, the light source units LSP may have the same size and shape. As another example, the light source units LSP may have different sizes and different shapes.

A support unit SUP may be provided on the substrate SUB. When viewed in a plane, the support unit SUP may surround the plurality of cell regions CEL. That is, the one support unit SUP may define the plurality of cell regions CEL.

One flexible layer FLL may be provided on the plurality of cell regions CEL. The flexible layer FLL is provided on the plurality of cell regions CEL, and may extend in a horizontal direction (that is, the first direction D1 and the second direction D2) across the plurality of cell regions CEL. When viewed in a plane, the flexible layer FLL may overlap the plurality of cell regions CEL and the plurality of light source units LSP.

The flexible layer FLL may be spaced apart from the light source units LSP, in a third direction D3, by the support unit SUP. The flexible layer FLL may include an actuator part ACP, a display part DIP, and a sensor part SSP which are sequentially laminated.

Referring to FIG. 18 and FIG. 19, light is emitted from some of the light source units LSP, and a shape of the flexible layer FLL on some portions of the cell regions CEL may change. For example, light may be emitted from the light source units LSP on the first and third cell regions CEL1 and CEL3. The mechanical stiffness of the actuator part ACP on the first and third cell regions CEL1 and CEL3 may be reduced. That is, the actuator part ACP on the first and third cell regions CEL1 and CEL3 may become flexible. On the other hand, the mechanical stiffness of the actuator part ACP on the second cell region CEL2 may be maintained as it is. That is, the actuator part ACP on the second cell region CEL2 may be rigid as it is.

As illustrated above with reference to FIG. 5, when an electric field is generated, the shape of the actuator part ACP, which becomes flexible on the first and third cell regions CEL1 and CEL3, may change. Therefore, the shape of the flexible layer FLL on the first and third cell regions CEL1 and CEL3 may change. A first protrusion region PP1 and a second protrusion region PP2 may be formed in the flexible layer FLL on the first and third cell regions CEL1 and CEL3, respectively.

On the other hand, since the actuator part ACP on the second cell region CEL2 is in a rigid state, the shape thereof may not change even though the electric field is generated. Thus, a protrusion region may not be formed on the second cell region CEL2.

The display part DIP on the first and third cell regions CEL1 and CEL3 may display color. Thus, each of the first and second protrusion regions PP1 and PP2 may have specific color.

According to the embodiment of the present invention, different shape deformation may occur on each of the plurality of cell regions CEL by the one flexible layer FLL supported by the one support unit SUP.

Generally, a plurality of support units SUP are provided in a shape-variable electronic device of the related art, and surround cell regions CEL, respectively, in one grid shape. In this case, since the support units SUP having a partition wall shape are disposed between neighboring cell regions CEL, the display area of a device increases, and shape deformation is restricted. However, since the one flexible layer FLL is disposed on the plurality of cell regions CEL in the present invention, various shapes may be obtained only by turning on/off the light source units LSP.

Figure 20:
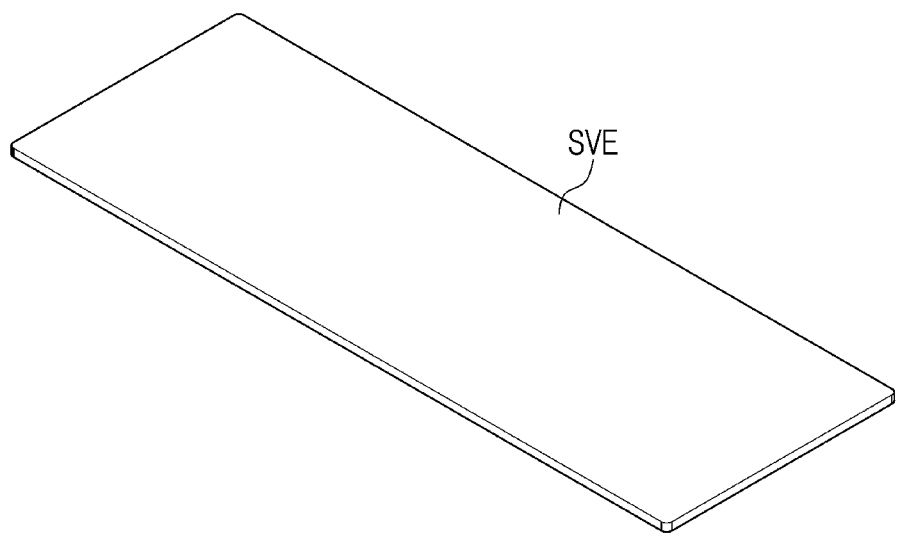
FIG. 20 is a perspective view illustrating one example of a shape-variable electronic device according to embodiments of the present invention.

FIG. 20 is a perspective view illustrating one example of a shape-variable electronic device according to embodiments of the present invention. Each of FIG. 21A and FIG. 21B is a perspective view showing an example in which a shape of the electronic device of FIG. 20 is deformed.

Referring to FIG. 20, a shape-variable electronic device SVE according to the present invention may be provided as a plate shape having a flat top surface.

Figure 21A:
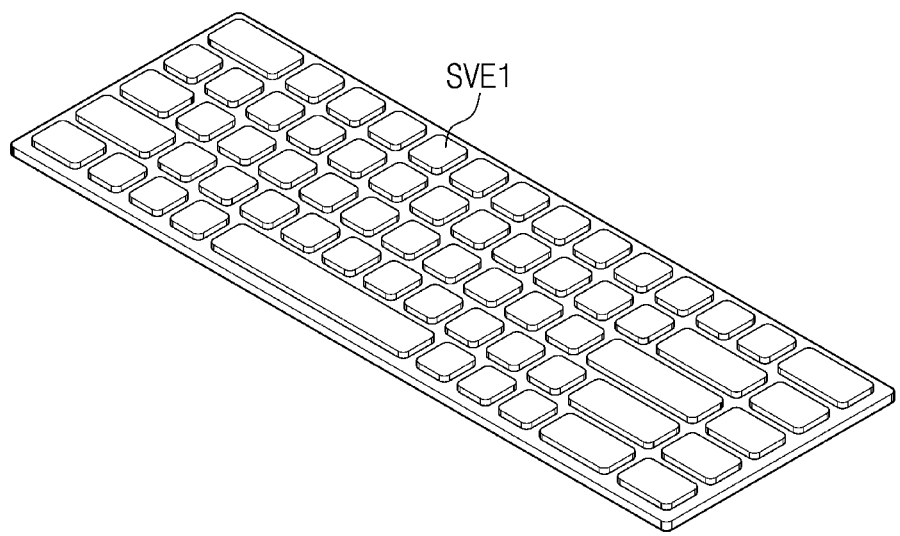
FIG. 21B is a perspective view showing an example in which a shape of the electronic device of FIG. 20 is deformed.

Referring to FIG. 21A, a shape of the shape-variable electronic device SVE of FIG. 20 may be changed into a keyboard shape SVE1 according to the user's needs. Particularly, the top surface of the device may protrude like the shape of keypads of a keyboard.

Figure 21B:
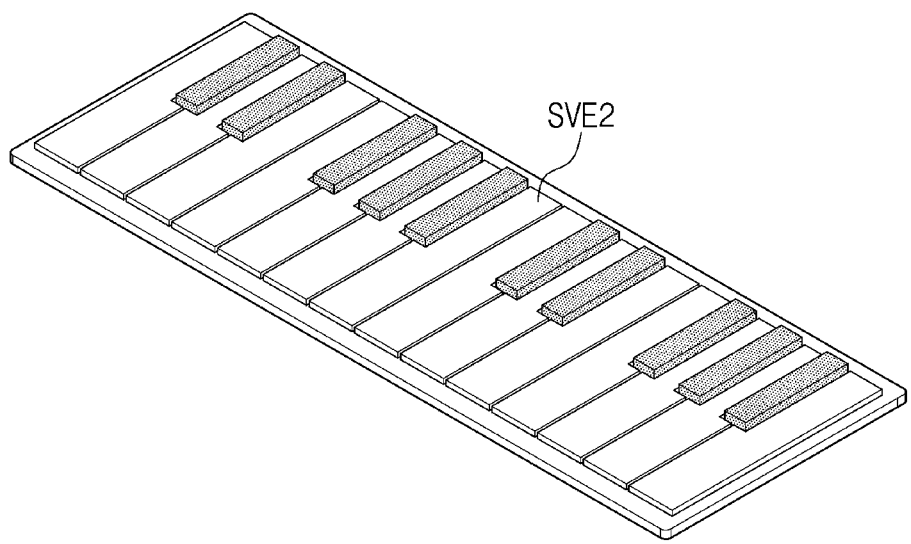

Referring to FIG. 21B, a shape of the shape-variable electronic device SVE of FIG. 20 may be changed into a piano key shape SVE2 according to the user's needs. Particularly, the top surface of the device may protrude like the shape of keys of a piano. Furthermore, the color of the keys may be produced through the display part DIP of the device.

The shape-variable electronic device according to embodiments of the present invention may be applied to various electronic apparatuses, in addition to those described above with reference to FIG. 20, FIG. 21A, and FIG. 21B. For example, the shape-variable electronic device of the present invention may be applied to a user manipulation apparatus embedded in a vehicle or a user manipulation apparatus applied in a mobile device. The shape-variable electronic device of the present invention may be applied to a braille apparatus for the blind. The shape-variable electronic device of the present invention may be applied to a relic experience apparatus in a museum.

Although the embodiments of the inventive concept are described with reference to the accompanying drawings, those with ordinary skill in the technical field to which the present invention pertains will understand that the present invention can be carried out in other specific forms without changing the technical idea or essential features. Therefore, the above-described embodiments are to be considered in all aspects as illustrative and not restrictive.

The invention claimed is:

1. A shape-variable electronic device comprising:
a substrate having a cell region;
a light source unit on the cell region; and
a flexible layer vertically spaced apart from the light source unit,
wherein the flexible layer comprises an actuator part that changes a shape of the flexible layer, and
the actuator part comprises:
a photo-thermal response part that receives light emitted from the light source unit and generates thermal energy;
a deformation part which receives the thermal energy from the photo-thermal response part and of which mechanical stiffness is reduced; and
a top electrode and a bottom electrode on both surfaces of the deformation part, respectively.

2. The shape-variable electronic device of claim 1, wherein the photo-thermal response part is embedded within the deformation part.

3. The shape-variable electronic device of claim 1, wherein the photo-thermal response part is a polymer film comprising a photo-thermal material.

4. The shape-variable electronic device of claim 1, wherein the photo-thermal response part comprises metallic patterns having a meta-structure.

5. The shape-variable electronic device of claim 1, wherein the photo-thermal response part comprises metallic particles dispersed within the deformation part, and
the metallic particles generate the thermal energy from the emitted light by using surface plasmon resonance.

6. The shape-variable electronic device of claim 1, wherein the deformation part comprises shape memory polymer.

7. The shape-variable electronic device of claim 1, wherein the bottom electrode and the top electrode generate electro-static force therebetween and change a shape of the deformation part having the reduced mechanical stiffness.

8. The shape-variable electronic device of claim 1, wherein the flexible layer further comprises a display part on the actuator part, and
the display part comprises at least one pixel.

9. The shape-variable electronic device of claim 8, wherein the display part comprises light emitting layers and electrodes which are alternately laminated on each other, and each of the light emitting layers comprises an electroluminescence material.

10. The shape-variable electronic device of claim 1, wherein the flexible layer further comprises a sensor part on the actuator part, and the sensor part recognizes a touch of a user.

11. The shape-variable electronic device of claim 1, wherein the cell region comprises a plurality of cell regions which are two-dimensionally arranged, the light source unit comprises a plurality of light source units which are in the plurality of cell regions, respectively, and when viewed in a plane, the flexible layer overlaps the plurality of cell regions.

12. The shape-variable electronic device of claim 11, further comprising a support unit that supports the flexible layer, wherein when viewed in a plane, the support unit surrounds the plurality of cell regions.

13. A shape-variable electronic device comprising:

a substrate having a plurality of cell regions which are two-dimensionally arranged;

a plurality of light source units in the plurality of cell regions, respectively;

a flexible layer on the plurality of cell regions, the flexible layer extending horizontally across the plurality of cell regions; and a support unit which is on the substrate and supports the flexible layer, wherein the flexible layer comprises:

a bottom electrode and a top electrode that generate electro-static force; and a deformation part between the bottom electrode and the top electrode, wherein a shape of the deformation part changes due to light emitted from the light source units and the electro-static force.

14. The shape-variable electronic device of claim 13, wherein the flexible layer further comprises a photo-thermal response part that receives the emitted light and transfers thermal energy to the deformation part.

15. The shape-variable electronic device of claim 13, wherein the deformation part comprises shape memory polymer.

16. The shape-variable electronic device of claim 13, wherein the flexible layer further comprises a display part on the deformation part, and the display part has pixels which are on the plurality of cell regions, respectively.

17. An operation method of a shape-variable electronic device that comprises a light source unit and a flexible layer on the light source unit, wherein the flexible layer comprises a photo-thermal response part, a bottom electrode, a top electrode, and a deformation part between the bottom and top electrodes, and the operation method comprises:

emitting light from the light source unit to the photo-thermal response part, wherein the photo-thermal response part receives the light and generates thermal energy;

heating the deformation part by using the thermal energy, wherein the deformation part is heated to reduce mechanical stiffness thereof; and generating electro-static force between the bottom and top electrodes to change a shape of the deformation part.

18. The operation method of claim 17, wherein the flexible layer further comprises a display part, and the operation method further comprises displaying a specific color, on the flexible layer having the changed shape, by using the display part.

19. The operation method of claim 17, wherein the flexible layer further comprises a sensor part, and the operation method further comprises recognizing a touch of a user, which is applied on the flexible layer having the changed shape, by using the sensor part.

20. The operation method of claim 17, wherein a shape of the flexible layer in a region, which is not irradiated with light from the light source unit, does not change.

* * * * *